United States Patent [19]
Wild et al.

[11] Patent Number: 5,714,393
[45] Date of Patent: Feb. 3, 1998

[54] DIODE-CONNECTED SEMICONDUCTOR DEVICE AND METHOD OF MANUFACTURE

[75] Inventors: Andreas A. Wild, Scottsdale; Robert B. Davies, Tempe, both of Ariz.

[73] Assignee: Motorola, Inc., Schaumburg, Ill.

[21] Appl. No.: 762,229

[22] Filed: Dec. 9, 1996

[51] Int. Cl.$^6$ .......................... H01L 21/04; H01L 21/265
[52] U.S. Cl. .................. 437/15; 437/40; 437/41; 437/904
[58] Field of Search .................. 437/15, 40, 41, 437/29, 904; 257/134, 136, 139, 287, 328

[56] References Cited

U.S. PATENT DOCUMENTS

| | | | |
|---|---|---|---|
| 5,053,849 | 10/1991 | Izawa et al. | 437/41 |
| 5,267,194 | 11/1993 | Jang | 257/328 |
| 5,302,536 | 4/1994 | Josquin | 437/41 |
| 5,358,879 | 10/1994 | Brady et al. | 437/44 |

OTHER PUBLICATIONS

"Field Effect-Transistor With Asymmetrical Structure", Codella et al., United States Statutory Invention Registration No. H986, Published Nov. 5, 1991, U.S. Class 437, Subclass 41, Application Filing Date Jun. 9, 1989.

*Primary Examiner*—John Niebling
*Assistant Examiner*—Michael S. Lebentritt
*Attorney, Agent, or Firm*—Rennie William Dover

[57] ABSTRACT

A compact diode-connected semiconductor device (20) and a method of manufacturing the field effect transistor (10). A doped layer (44) is formed in a semiconductor substrate (41) which serves as a drain extension region. An oxide layer (46) is formed on the semiconductor substrate (41) and an opening (50) is formed in the oxide layer (46). A gate structure (81) having an active gate portion (78) and a gate shorting structure (22) are formed on the oxide layer (46). The gate shorting structure (22) and the portion of the semiconductor substrate (41) adjacent the active gate portion (78) are doped with an impurity material of the same conductivity type as the doped layer (44). The gate shorting structure (22) serves as a source of impurity material for the drain region.

12 Claims, 4 Drawing Sheets

FIG. 1 —PRIOR ART—

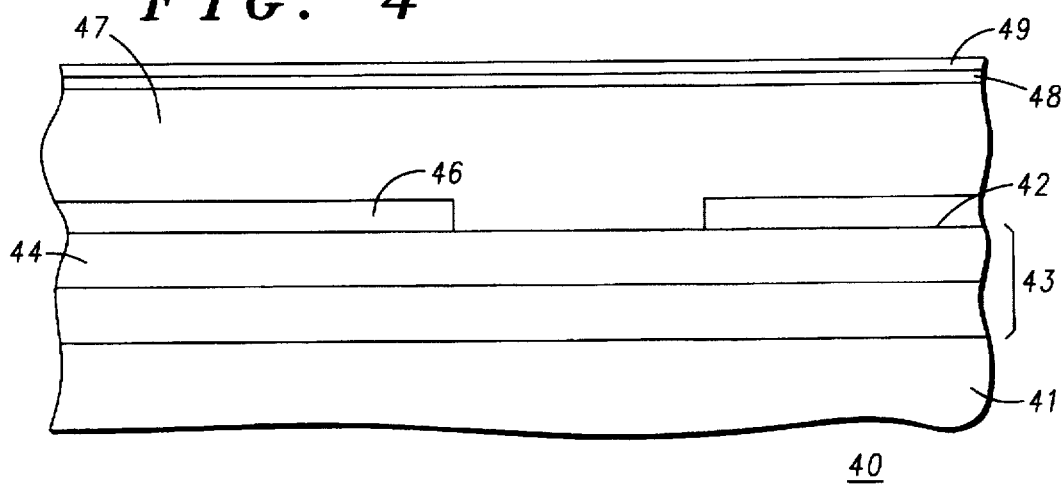
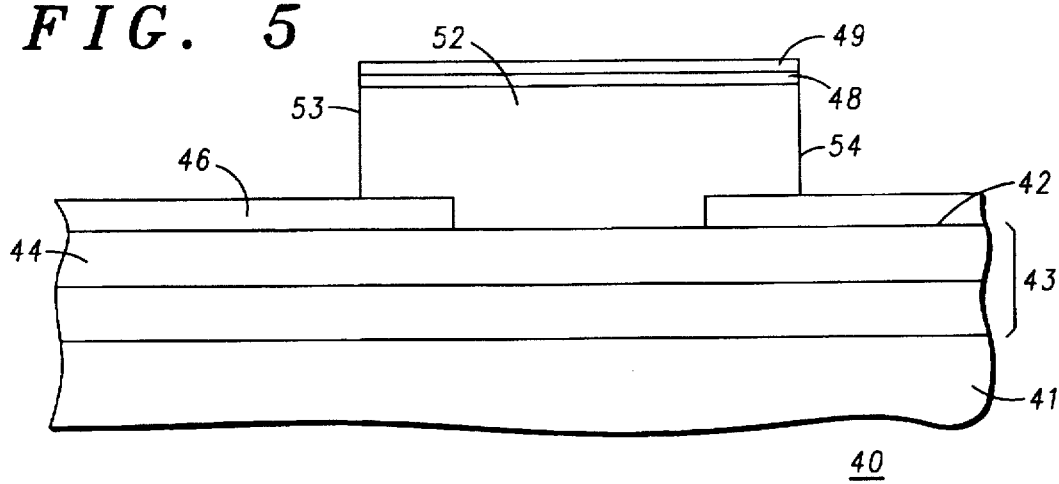
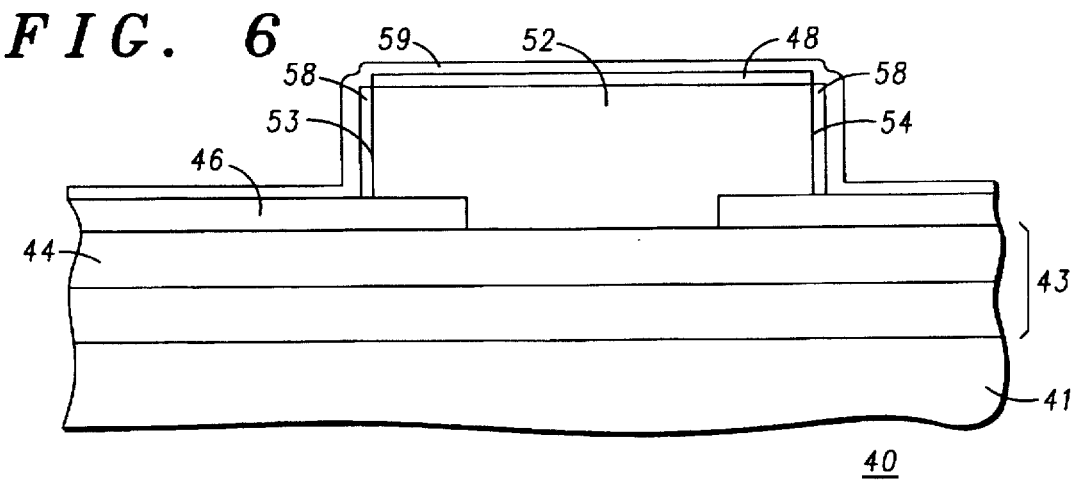

DIODE-CONNECTED SEMICONDUCTOR DEVICE AND METHOD OF MANUFACTURE

FIELD OF THE INVENTION

The present invention relates, in general, to semiconductor devices, and more particularly, to semiconductor diodes.

BACKGROUND OF THE INVENTION

An important goal in the manufacture of semiconductor devices is reducing the amount of semiconductor area they occupy. This reduces the overall cost of manufacturing semiconductor components, thereby increasing the profit margins of semiconductor manufacturers. An important semiconductor device used in applications such as current sources, active loads, and the like is a semiconductor diode. Conventional Metal Oxide Semiconductor (MOS) type transistors can be used as a diode by connecting their gate to their drain. Typically, connecting the gate to drain of a conventional MOS type transistor consumes a large amount of semiconductor area.

Accordingly, it would be advantageous to have a diode-connected semiconductor device and method of manufacturing the diode-connected semiconductor device that reduces the amount of semiconductor area that it occupies.

BRIEF DESCRIPTION OF THE DRAWINGS

FIG. 1 is a plan view of a prior art diode-connected semiconductor device;

FIGS. 3–12 illustrate highly enlarged cross-sectional views of a portion of a diode-connected semiconductor device during manufacture in accordance with the present invention.

DETAILED DESCRIPTION OF THE DRAWINGS

Figure 2:
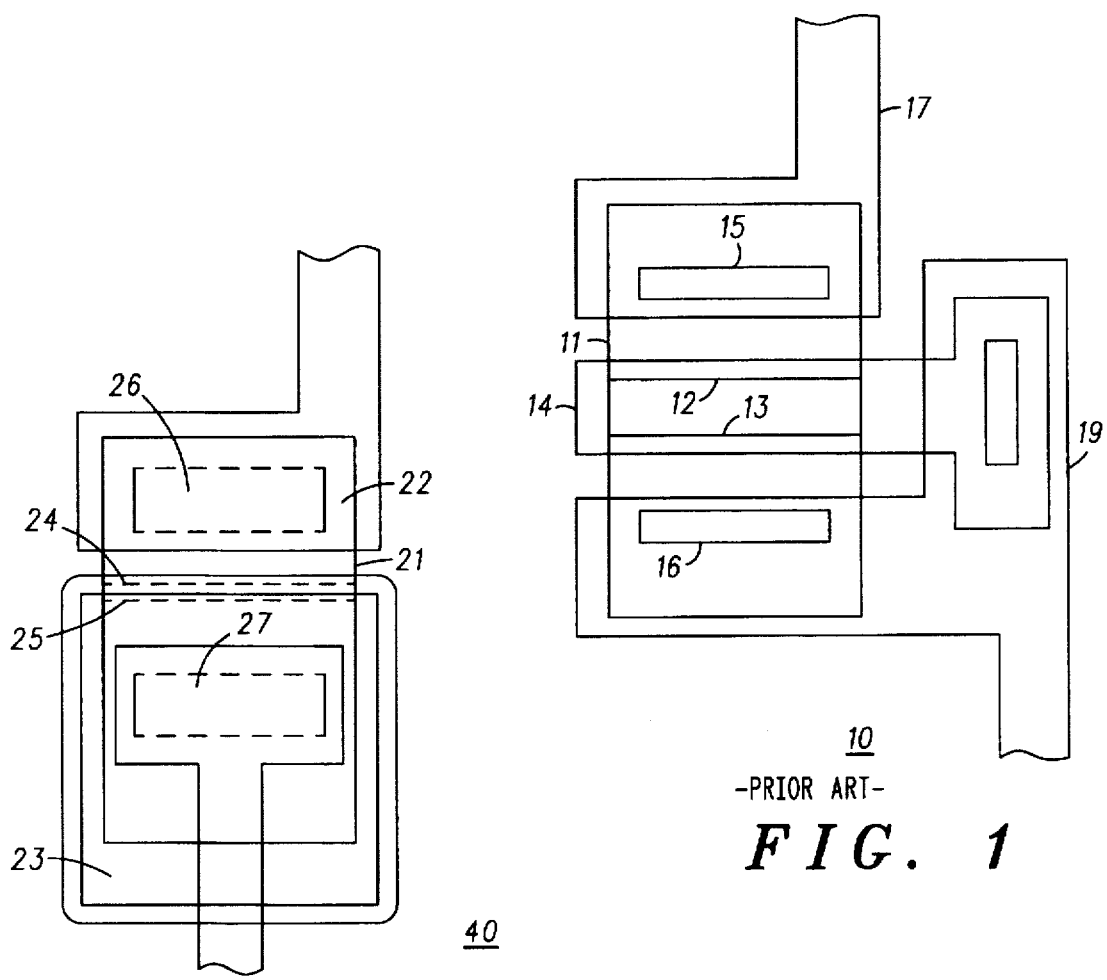
FIG. 2 is a plan view of a diode-connected semiconductor device in accordance with the present invention.

Generally, the present invention provides a diode-connected semiconductor device and a method of fabricating or forming the diode-connected semiconductor device. Diode-connected semiconductor devices manufactured in accordance with the present invention are comprised of an asymmetric insulated gate semiconductor device coupled as a diode. More particularly, the gate and drain of the asymmetric semiconductor device are commonly coupled so that the insulated gate semiconductor device forms a diode. An advantage of a diode fabricated in accordance with the present invention is that it occupies less silicon area than conventional symmetric transistors. This advantage is obtained because the use of an asymmetric semiconductor device pre-defines the drain region. Thus, the drain region can be placed at the edge of the gate structure. As those skilled in the art are aware, asymmetric semiconductor devices are also referred to as unilateral semiconductor devices, whereas symmetric semiconductor devices are referred to as bilateral semiconductor devices.

It shall be understood that the same reference numerals are used in the figures to denote the same elements. It shall be further understood that the materials, concentrations, and thicknesses provided in the description of the present invention merely serve as examples and are not limitations of the present invention.

FIG. 1 is a plan view of a prior art diode-connected field effect transistor 10. Diode-connected field effect transistor 10 has an active region 11 which contains the source and drain regions, 12 and 13, respectively. A gate structure 14 overlies the portion of active region 11 between source and drain regions 12 and 13, respectively. This region is commonly referred to as the channel region. A source contact 15 is formed in source region 12 and a drain contact 16 is formed in drain region 13. A source electrode 16 is formed to contact source contact 15 and a gate-drain electrode 19 is formed to commonly contact gate structure 14 and drain contact 16. As those skilled in the art are aware, the distance between source and drain regions 12 and 13, respectively, i.e., the channel region, is the effective channel length of prior art device 10.

FIG. 2 is a plan view of a diode-connected semiconductor device 40 in accordance with the present invention. Diode-connected semiconductor device 40 has an active region 21 which contains the source and drain regions 22 and 23, respectively. A source contact 26 is formed in source region 22 and a drain contact 27 is formed to contact drain region 23. Source region 22 extends to a location indicated by dashed line 24 and drain region 23 extends to a location indicated by dashed line 25. The distance between dashed lines 24 and 25 represents the effective channel length of diode-connected semiconductor device 40.

A gate electrode 28 is formed over the channel region. Gate electrode 28 is comprised of an active gate portion 30 and a gate shorting portion which contacts drain contact 27. The gate shorting portion serves as a dopant source which further dopes drain region 23.

Figure 3:
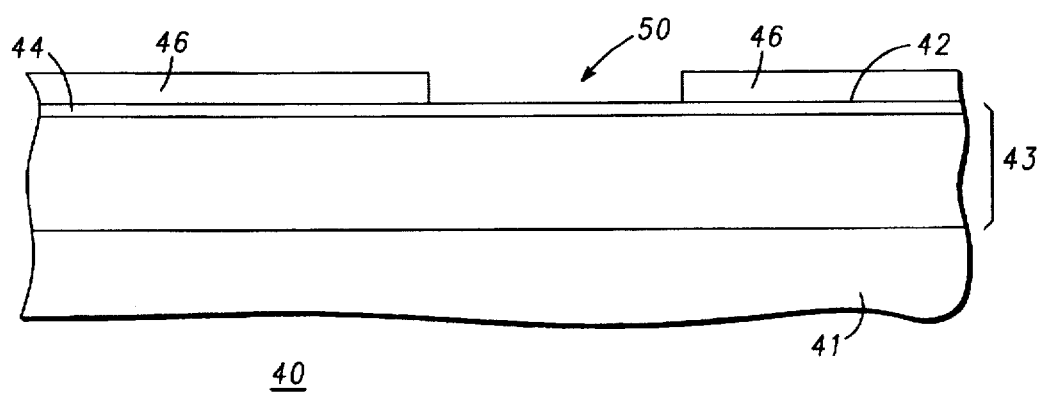

FIG. 3 illustrates an enlarged cross-sectional view of a portion of a partially completed diode-connected N-channel semiconductor device 40 during processing in accordance with an embodiment of the present invention. What is shown in FIG. 3 is a substrate 41 having an epitaxial layer 43 disposed thereon. By way of example, epitaxial layer 43 is of P conductivity type, has a major surface 42, and ranges in thickness between approximately 2 microns (μm) and 5 μm. Substrate 41 has, for example, a resistivity ranging from approximately 0.01 ohm-centimeter (Ω-cm) to approximately 0.1 Ω-cm, and P-type epitaxial layer 43 has a resistivity between approximately 6 Ω-cm and approximately 8 Ω-cm. P-type epitaxial layer 43 has a surface concentration on the order of $5 \times 10^{15}$ atoms per cubic centimeter (atoms/cm$^3$). Although the description of the present invention includes the combination of substrate 41 and P-type epitaxial layer 43 to prevent latch-up, it should be understood that the semiconductor devices of the present invention may be manufactured in a semiconductor material such as substrate 41 using the doping concentrations specified for epitaxial layer 43.

An impurity material of N conductivity type is implanted into a portion of P-type epitaxial layer 43 to form a doped layer 44. Although doped layer 44 is shown as extending across an entire portion of P-type epitaxial layer 43, it should be understood that doped layer 44 may be formed to extend across a subportion of P-type epitaxial layer 43. It should be noted that doped layer 44 serves as a drain extension region for semiconductor device manufactured in P-type epitaxial layer 43. Further, the drain extension region permits formation of a compact diode-connected transistor.

By way of example, layer 44 has a surface concentration ranging from approximately $7 \times 10^{16}$ atoms/cm$^3$ to approximately $2 \times 10^{17}$ atoms/cm$^3$. A suitable set of implant conditions to obtain the aforementioned surface concentration includes an implant dose ranging from approximately $1 \times 10^{12}$ atoms per square centimeter (atoms/cm$^2$) to approximately $3 \times 10^{12}$ atoms/cm$^2$ and an implant energy ranging from approximately 50 kilo-electron volts (KeV) to approximately 200 KeV.

A layer 46 of dielectric material is formed on major surface 42. A suitable technique for forming oxide layer 46 is thermal oxidation. Preferably, oxide layer 46 has a thickness of at least 400 angstroms. In accordance with the present invention, oxide layer 46 has a thickness in the range of approximately 600 angstroms to approximately 1,800 angstroms. A typical thickness of oxide layer 46 is approximately 1,200 angstroms. It should be noted that portions of oxide layer 46 serve as portions of a gate oxide for a diode-connected transistor.

An etch protect mask (not shown) such as, for example, photoresist is formed on oxide layer 46. An opening is formed in the photoresist to expose a portion of oxide layer 46. The exposed portion of oxide layer 46 is etched to form an opening 50 that exposes a portion of doped layer 44. The etch protect mask is removed. Techniques for forming etch protect masks, etching oxide layers, and removing etch protect masks are known to those skilled in the art. The type of material for the etch protect mask is not a limitation of the present invention. Other suitable materials for the etch protect mask include nitride, silicon nitride, or the like.

Now referring to FIG. 4, a layer 47 of polysilicon is formed on oxide layer 46 using, for example, a chemical vapor deposition technique. Polysilicon layer 47 contacts doped layer 44 through opening 50 (FIG. 3). Thus, polysilicon layer 47 fills opening 50. A suitable thickness range for polysilicon layer 47 is from approximately 2,500 angstroms to approximately 4,000 angstroms. A typical thickness for polysilicon layer 47 is approximately 3,300 angstroms. A layer 48 of dielectric material is formed on polysilicon layer 47. Layer 48 of dielectric material may be a layer of oxide formed by the decomposition of tetraethyl orthosilicate (TEOS). Oxide layers formed by the decomposition of tetraethyl orthosilicate are commonly referred to as TEOS layers. By way of example, oxide layer 48 has a thickness ranging from approximately 50 angstroms to approximately 400 angstroms and a nominal thickness of approximately 150 angstroms. A layer 49 of silicon nitride is formed on layer of dielectric material 48 using, for example, a low pressure chemical vapor deposition (LPCVD) technique. A suitable range of thicknesses for silicon nitride layer 49 is between approximately 150 angstroms and approximately 350 angstroms, and a nominal thickness for silicon nitride layer 49 is approximately 250 angstroms. It should be noted that the impurity material of doped layer 44 is activated or driven into P-type epitaxial layer 43 by the processing steps described herein.

Now referring to FIG. 5, a gate shorting structure 52 is formed over a portion of P-type epitaxial layer 43. Gate shorting structure 52 forms part of a gate structure 81 (shown FIG. 10). It should be noted that gate shorting structure 52 is formed from polysilicon layer 47 and that gate shorting structure 52 has sides 53 and 54. Further, a portion of gate shorting structure 52 contacts doped layer 44. Gate shorting structure 52 is formed by anisotropically etching nitride layer 49, oxide layer 48, and polysilicon layer 47. Gate shorting structure 52 may be formed, for example, by coating silicon nitride layer 49 with a layer of photoresist (not shown), exposing the portions of silicon nitride layer 49 to be removed (using, for example, photolithographic techniques), and anisotropically etching the exposed portions of silicon nitride layer 49. In addition, the portions of oxide layer 48 and polysilicon layer 47 below the exposed portions of silicon nitride layer 49 are also etched, thereby exposing portions of oxide layer 46.

Now referring to FIG. 6, a layer 58 of oxide is formed on the exposed sides 53 and 54 of gate shorting structure 52. By way of example, oxide layer 58 is formed by thermally oxidizing sides 53 and 54. A suitable thickness range for oxide layer 58 is between approximately 50 angstroms and approximately 250 angstroms, and a nominal thickness of oxide layer 58 is approximately 100 angstroms. Although the formation of oxide layer 58 by thermal oxidization increases the thickness of oxide layer 46, the increased thickness of layer 46 is not shown to simplify the description of the present invention.

A conformal layer 59 of dielectric material is formed on gate shorting structure 52 and oxide layers 48 and 58. By way of example, layer 59 of dielectric material is silicon nitride having a thickness ranging from approximately 250 angstroms to approximately 750 angstroms and a nominal thickness of approximately 400 angstroms.

Figure 7:
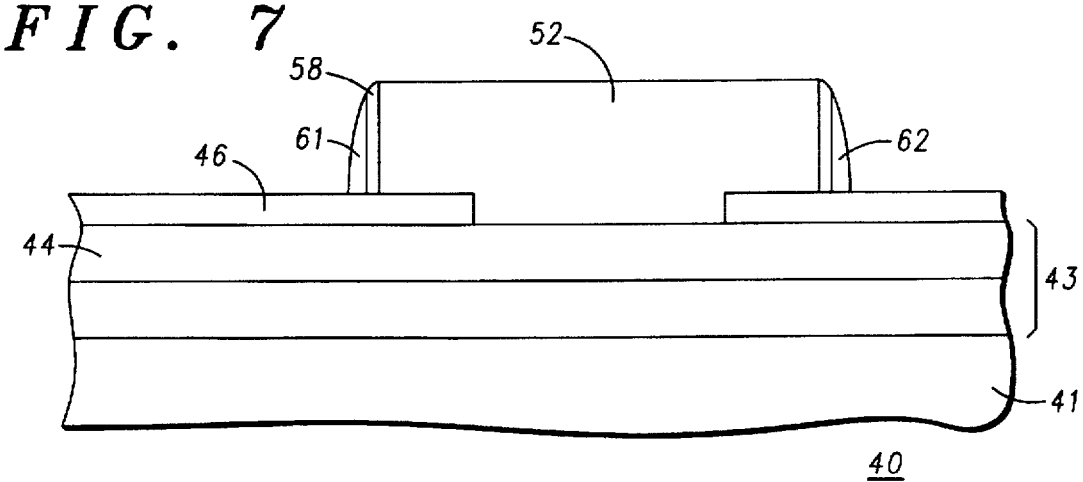

Now referring to FIG. 7, silicon nitride layer 59 is anisotropically etched to form spacers 61 and 62 adjacent a portion of oxide layer 58 on opposing sides of gate shorting structure 52. A suitable technique for etching silicon nitride layer 59 includes a reactive ion etch (RIE) using etchants such as $CF_4$, $NF_3$, and the like. In addition, the anisotropic etch step may remove a portion of oxide layer 46. For example, oxide layer 46 is thinned to approximately 400 angstroms after the formation of spacers 61 and 62. It should be noted that spacer 61 shapes oxide layer 46 in order to create a repeatable undercut etch profile.

Figure 8:
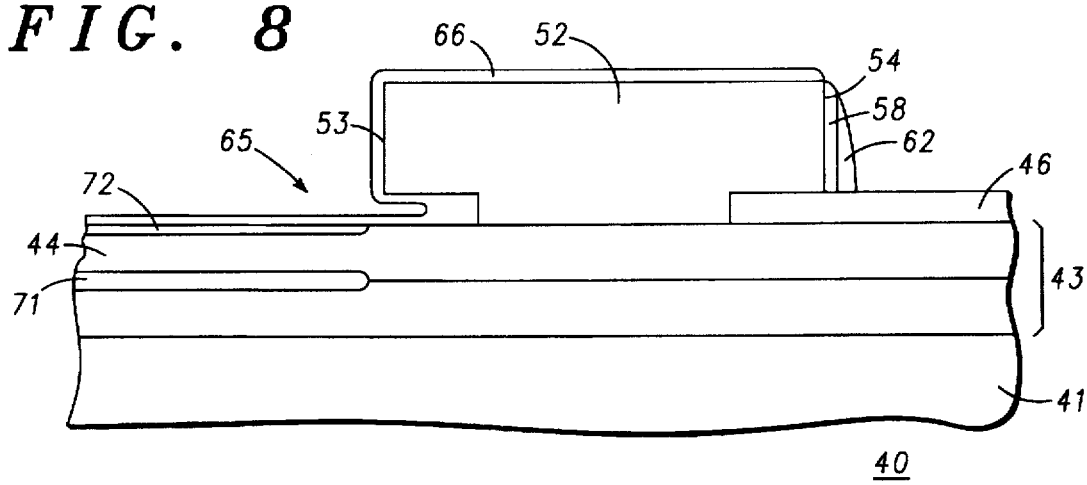

Now referring to FIG. 8, a layer of photoresist (not shown) is formed on subportions of gate shorting structure 52 and on spacer 62. Spacer 61 and the portions of oxide layers 16 and 58 which are not covered by the layer of photoresist are removed via a sequence of isotropic etches, i.e., a first etch step to remove spacer 61 and a second etch step to remove portions of oxide layer 46 between gate shorting structure 52 and a portion of major surface 42. In other words, gate shorting structure 52 is undercut on one side to form a cavity 65 underneath gate shorting structure 52, i.e., between gate shorting structure 52 and major surface 42. The layer of photoresist is removed.

Still referring to FIG. 8, a screen oxide 66 is formed on the exposed portions of gate shorting structure 52 and on the exposed portions of major surface 42. By way of example, oxide layer 66 has a thickness ranging from approximately 100 angstroms to approximately 200 angstroms and a nominal thickness of approximately 150 angstroms. Although oxide layer 66 is also formed on oxide layer 46, it should be noted that to simplify the description of the present invention, these portions of oxide layer 66 are not shown. A layer of photoresist (not shown) is formed on portions of oxide 66 disposed on gate shorting structure 52, spacer 62, and portions of oxide layer 46 adjacent side 54. This layer of photoresist serves as an implant block mask.

An enhanced doped region 71 is formed by doping a portion of P-type epitaxial layer 43 with an impurity material of P conductivity type such as, for example, boron. More particularly, the boron is implanted into a portion of P-type epitaxial layer 43 to form doped region 71. Dopant region 71 is laterally aligned to oxide layer 66 disposed on side 53 of gate shorting structure 52. It should be noted that doped region 71 is spaced apart from major surface 42. A suitable set of implant parameters includes implanting the P type impurity material at a dose ranging from approximately $2 \times 10^{12}$ atoms/cm$^2$ to approximately $2 \times 10^{13}$ atoms/cm$^2$ at an implant energy ranging from approximately 40 KeV to approximately 100 KeV. Thus, the boron that forms doped region 71 is implanted into P-type epitaxial layer 43 to a depth or distance ranging between approximately 1,500 and approximately 3,000 angstroms. The impurity material or dopant forming doped region 71 serves to provide punch-through protection for an N-channel transistor.

An enhanced doped region 72 is formed by doping another portion of P-type epitaxial layer 43 with boron. By way of example, implant parameters for the formation of doped region 72 include a dose ranging from approximately $5\times10^{11}$ atoms/cm$^2$ to approximately $1\times10^{13}$ atoms/cm$^2$ and a suitable implant energy ranging from approximately 10 KeV to approximately 20 KeV. Thus, the boron that forms doped region 72 is implanted into a portion of P-type epitaxial layer 43 to a depth or distance ranging from approximately 200 to approximately 1,200 angstroms. The impurity material forming doped region 72 serves to adjust the threshold voltage of the N-channel transistor. The layer of photoresist is removed. Enhanced doped regions 71 and 72 provide threshold voltage adjustment and prevent punch-through.

Figure 9:
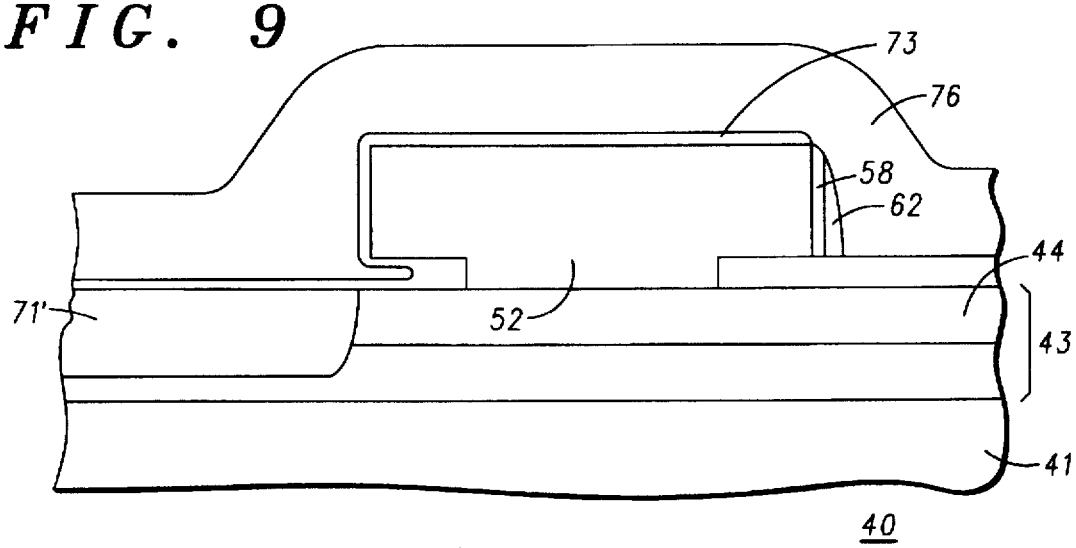

Now referring to FIG. 9, screen oxide 46 is removed from gate shorting structure 52 and portions of major surface 42, thereby exposing subportions of gate shorting structure 52 and portions of major surface 42. An oxide layer 73 is formed on the exposed portions of major surface 42 and the exposed regions of gate shorting structure 52.

A conformal layer 76 of, for example, polysilicon having a thickness ranging between approximately 1,000 angstroms and approximately 2,500 angstroms is deposited on oxide layer 73, spacer 62, and the remaining portions of oxide layer 46. Nominally, polysilicon layer 76 has a thickness of approximately 1,750 angstroms. Although doped regions 71 and 72 are initially spaced apart, it should be noted that they diffuse towards each other and form a single doped region 71'.

Figure 10:
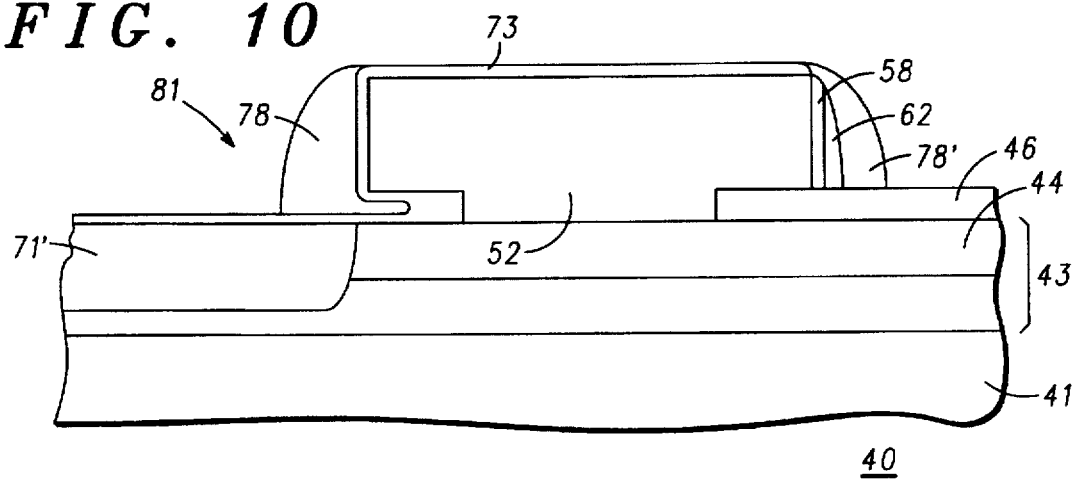

Now referring to FIG. 10, polysilicon layer 76 is anisotropically etched to form active gate 78 adjacent side 53 and a spacer 78' adjacent spacer 62. It should be noted that active gate 78 is spaced apart from side 53 by a portion of oxide layer 73. The anisotropic etch step that forms active gate 78 stops on or in oxide layer 73. Thus, a gate structure 81 comprises a gate shorting structure 52 and an active gate 78, thus the gate structure is referred to as a shorted gate structure. Gate shorting structure 52 is formed from a portion of polysilicon on the oxide layer 46 which has a first width. Active gate portion 78 is formed from a portion of polysilicon on a oxide layer 73 which has a second width, wherein the second width is less than the first width.

Figure 11:
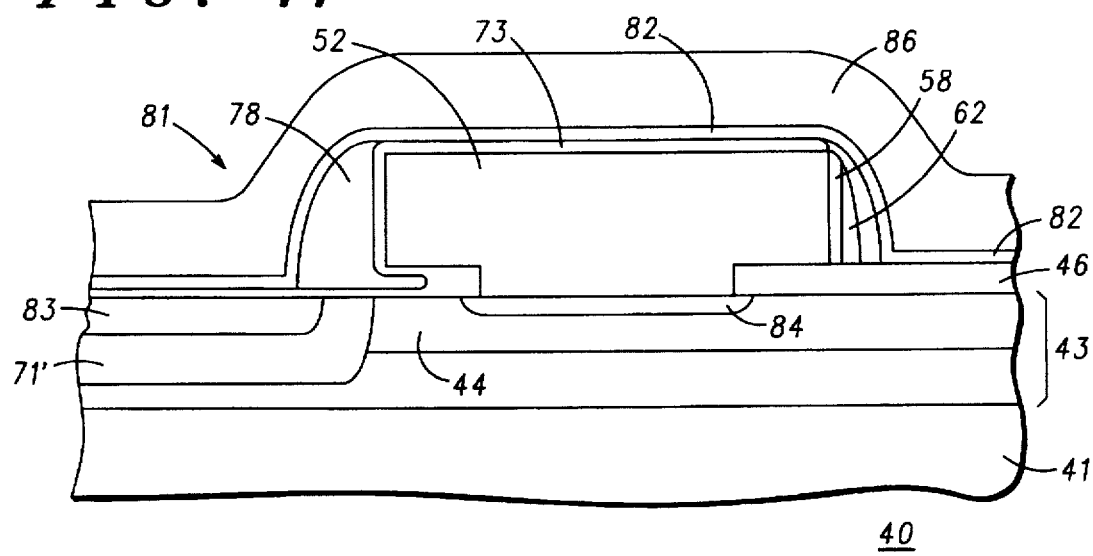

Now referring to FIG. 11, a layer of photoresist (not shown) is formed on gate shorting structure 52, active gate 78, and the portions of oxide layer 73 adjacent active gate 78. In other words, active gate 78 and the portions of oxide layer 73 adjacent active gate 78 are uncovered by photoresist, i.e., they are exposed. The layer of photoresist serves as an etch protect mask. Spacers 78' and 62 are removed using, for example, an isotropic plasma etch. It should be noted that spacers 78' and 62 may be completely removed or reduced in size. In addition, the exposed portions of oxide layer 46 are also removed. The layer of photoresist is removed.

It should be understood that active gate 78 cooperates with gate shorting structure 52 and the portions of oxide layer 73 on P-type epitaxial layer 43 to form gate-drain shorting structure 81. The portions of oxide layer 73 between active gate 78 and major surface 42 serve as active gate oxide.

An oxide layer 82 is conformally deposited on the remaining portions of oxide layer 73, spacer 62, and active gate 78. By way of example, oxide layer 82 has a thickness ranging from approximately 100 angstroms to approximately 300 angstroms, wherein a nominal thickness of oxide layer 82 is approximately 150 angstroms.

A source/drain implant is performed to form a source region 83 and a drain region 84. In addition, the source/drain implant further dopes gate structure 81. A suitable set of implant parameters for the source/drain implant includes implanting an N type impurity material such as arsenic, at a dose in the range of approximately $1\times10^{15}$ atoms/cm$^2$ to approximately $1\times10^{16}$ atoms/cm$^2$, and a suitable implant energy ranges from approximately 60 KeV to approximately 120 KeV.

Still referring to FIG. 11, a conformal layer 86 of dielectric material is formed on oxide layer 82. By way of example, layer 86 of dielectric material is silicon nitride having a thickness ranging from approximately 1,000 angstroms to approximately 2,250 angstroms. A nominal thickness of silicon nitride layer 86 is 2,000 angstroms.

Figure 12:
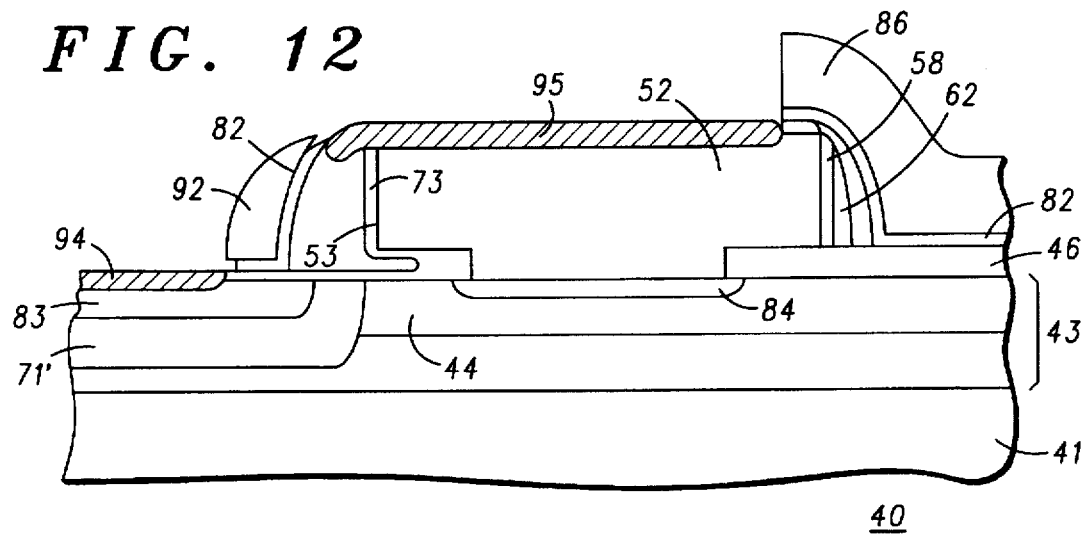

Now referring to FIG. 12, silicon nitride layer 86 and oxide layer 82 are anisotropically etched to form oxide spacers 91 and nitride spacer 92 adjacent side 53. In addition, the anisotropic etch step exposes gate shorting structure 52 and active gate 78 of gate structure 81, as well as the portion of major surface 42 adjacent spacers 92. Using techniques well known in the art, a silicide 94 is formed on doped region 83 and a silicide 95 is formed on gate shorting structure 52. It should be noted that silicide 95 serves as a conductive strap coupling gate shorting structure 52 to active gate 78. Further, polysilicon may be used as a conductive strap coupling gate shorting structure 52 to active gate 78. As those skilled in the art are aware electrical interconnects may be formed to contact silicide 94 and 95.

By now it should be appreciated that a semiconductor device and a method manufacturing the semiconductor device have been provided. In accordance with the present invention, a lightly doped drain extension implant is performed at the beginning stages of manufacture allowing the formation of a gate oxide having a thick portion and a thin portion. Further, the lightly doped drain extension implant allows the formation of a compact diode structure.

We claim:

1. A method for fabricating a semiconductor device, comprising the steps of:
   providing a semiconductor material of a first conductivity type and having a major surface;
   forming a doped layer of a second conductivity type extending from the major surface into the semiconductor material;
   forming a layer of dielectric material over the major surface;
   removing a first portion of the layer of dielectric material overlying a portion of the doped layer;
   forming a shorting structure having a first portion and a second portion, the first portion overlying the layer of dielectric material and the second portion contacting the doped layer;
   laterally removing a second portion of the layer of dielectric material to form a cavity, the cavity extending between the first portion of the shorting structure and the major surface;
   doping at least one portion of the semiconductor material adjacent the first portion of the shorting structure with a dopant of the first conductivity type;

forming a gate structure adjacent the first portion of the shorting structure; and doping the shorting structure and a portion of the semiconductor material adjacent the gate structure with an impurity material of the second conductivity type.

2. The method of claim 1, wherein the step of laterally removing the second portion of the layer of dielectric material to form the cavity includes exposing a first side of the first portion of the shorting structure.

3. The method of claim 2, wherein the step of laterally removing the second portion of the layer of dielectric material to form the cavity includes exposing a portion of the major surface adjacent the cavity and a portion of the major surface adjacent the first side of the first portion of the shorting structure.

4. The method of claim 3, further including forming another layer of dielectric material adjacent at least the first portion of the shorting structure.

5. The method of claim 1, wherein the step of doping at least one portion of the semiconductor material adjacent the first portion of the shorting structure includes changing a conductivity type of a portion of the semiconductor material adjacent the major surface to be of the first conductivity type and further including the step of doping the first portion of the shorting structure with the dopant of the second conductivity type.

6. The method of claim 1, wherein the step of forming the shorting structure includes using polysilicon as the shorting structure.

7. The method of claim 1, further including the step of electrically coupling the gate structure to the first portion of the shorting structure.

8. The method of claim 7, wherein the step of electrically coupling includes using silicide to electrically couple the gate structure to the first portion of the shorting structure.

9. The method of claim 7, wherein the step of electrically coupling includes using polysilicon to electrically couple the gate structure to the first portion of the shorting structure.

10. A method for forming a semiconductor device, comprising the steps of:

providing a semiconductor material of a first conductivity type and having a major surface;

forming a first doped layer of a second conductivity type extending from the major surface into the semiconductor material;

forming a first layer of dielectric material on the major surface;

forming an opening in the first layer of dielectric material to expose a portion of the first doped layer;

depositing a layer of conductive material over the first layer of dielectric material, the layer of conductive material contacting the first doped layer through the opening;

forming a first portion of a shorted gate structure on the first layer of dielectric material, the first portion of the shorted gate structure having first and second sides and contacting the first doped layer;

forming a first cavity extending under the first portion of the shorted gate structure from the first side and exposing a portion of the major surface; forming at least one enhanced doped region of the first conductivity type in the semiconductor material, the at least one enhanced doped region aligned to the first side of the first portion of the first portion of the shorted gate structure;

forming a second layer of dielectric material on the first portion of the shorted gate structure and the portion of the major surface that is exposed;

forming a second portion of the shorted gate structure on the second layer of dielectric material, the second portion of the shorted gate structure having first and second sides and the second side of the second portion of the shorted gate structure adjacent the first side of the first portion of the shorted gate structure;

doping a first region of the semiconductor material and the first portion of the shorted gate structure with an impurity material of the second conductivity type, the first region aligned to the first side of the second portion of the shorted gate structure; and forming a first conductive strap which couples the first and second portions of the shorted gate structure.

11. The method of claim 10, wherein the step of forming at least one enhanced doped region of the first conductivity type in the semiconductor material further includes forming a screen oxide on the first portion of the shorted gate structure and on the portion of the major surface that is exposed, and implanting impurities of the first conductivity type into the semiconductor material.

12. The method of claim 10, wherein the step of forming the second portion of the shorted gate structure includes depositing one of a semiconductor material or a conductor material on the second layer of dielectric material, wherein the one of a semiconductor material or a conductor material fills a portion of the first cavity.

* * * * *